United States Patent
Yui et al.

(10) Patent No.: US 9,355,843 B2
(45) Date of Patent: May 31, 2016

(54) SEMICONDUCTOR DEVICE AND METHOD OF MANUFACTURING THE SAME

(71) Applicant: Sumitomo Electric Industries, Ltd., Osaka (JP)

(72) Inventors: Keiichi Yui, Yokohama (JP); Ken Nakata, Yokohama (JP); Tsuyoshi Kouchi, Yokohama (JP); Isao Makabe, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/810,023

(22) Filed: Jul. 27, 2015

(65) Prior Publication Data

US 2015/0332915 A1 Nov. 19, 2015

Related U.S. Application Data

(63) Continuation of application No. 14/297,464, filed on Jun. 5, 2014, now Pat. No. 9,123,534.

(30) Foreign Application Priority Data

Jun. 7, 2013 (JP) .................. 2013-121079

(51) Int. Cl.
*H01L 21/02* (2006.01)
*H01L 29/43* (2006.01)
*H01L 29/66* (2006.01)
*H01L 29/778* (2006.01)
*H01L 29/20* (2006.01)

(52) U.S. Cl.
CPC ........ *H01L 21/0254* (2013.01); *H01L 21/0237* (2013.01); *H01L 21/0242* (2013.01); *H01L 21/02378* (2013.01); *H01L 21/02381* (2013.01); *H01L 21/02389* (2013.01); *H01L 21/02414* (2013.01); *H01L 21/02458* (2013.01); *H01L 21/02505* (2013.01); *H01L 29/432* (2013.01);

(Continued)

(58) Field of Classification Search
CPC ............. H01L 21/0254; H01L 21/02378; H01L 21/02381; H01L 21/02389; H01L 21/02414; H01L 21/0242; H01L 21/0237; H01L 21/02458; H01L 21/02505; H01L 21/0262; H01L 29/432; H01L 29/66462; H01L 29/7786
See application file for complete search history.

(56) References Cited

U.S. PATENT DOCUMENTS

| 2010/0327322 A1 | 12/2010 | Kub et al. |
| 2011/0108887 A1 | 5/2011 | Fareed et al. |

(Continued)

FOREIGN PATENT DOCUMENTS

JP     2012-256704 A     12/2012

OTHER PUBLICATIONS

"MOVPE growth and characterization of InAlGaN films and InGaN/InAlGaN MQW structures" by S. Suihkonen on Journal of Crystal Growth 310 (2008) 1777-1780.*

(Continued)

*Primary Examiner* — Yasser A Abdelaziez
*Assistant Examiner* — Farun Lu
(74) *Attorney, Agent, or Firm* — Venable LLP; Michael A. Sartori

(57) ABSTRACT

A method of manufacturing a semiconductor device according to one aspect of the present invention includes a step of forming a first layer of InAlN, a step of forming a second layer of InAlGaN on the first layer under a growth temperature higher than that of the first layer, and a step of forming a third layer of GaN, AlGaN or InGaN under a growth temperature higher than that of the first layer.

5 Claims, 12 Drawing Sheets

(52) U.S. Cl.
CPC ...... *H01L 29/66462* (2013.01); *H01L 29/7786* (2013.01); *H01L 21/0262* (2013.01); *H01L 29/2003* (2013.01)

(56) References Cited

U.S. PATENT DOCUMENTS

2011/0278586 A1* 11/2011 Ando et al. ......... H01L 29/0649 257/76
2013/0134439 A1    5/2013 Miyoshi et al.

OTHER PUBLICATIONS

"Effect of the growth temperature and the AlN mole fraction on in incorporation and properties of quaternary III-nitride layers grown by molecular beam epitaxy" by S. Fernande-Garrido on Journal of Applied Physics 104, 083510 (2008).*

Reuters etc. "Relaxation and critical strain for maximum in incorporation in AlInGaN on GaN grown by metal organic vapour phase epitaxy," Journal of Applied Physics 112, 093524 (2012).

* cited by examiner

SEMICONDUCTOR DEVICE AND METHOD OF MANUFACTURING THE SAME

CROSS REFERENCE TO RELATED APPLICATIONS

This application is a Continuation of U.S. patent application Ser. No. 14/297,464, filed Jun. 5, 2014, which claims the benefit of Japanese Patent Application No. 2013-121079, filed Jun. 7, 2013.

BACKGROUND OF THE INVENTION

1. Field of the Invention

The present invention relates to a semiconductor device and a method of manufacturing the same, and for example, to a semiconductor device having an InAlN layer and a method of manufacturing the same.

2. Related Background Art

A semiconductor device using a nitride semiconductor is used for, for example, power elements operating at a high frequency and high output. An HEMT (High Electron Mobility Transistor) having an electron traveling layer and an electron supply layer is known as the semiconductor device using a nitride semiconductor. In the HEMT, a two-dimensional electron gas is formed within the electron traveling layer due to spontaneous polarization and piezoelectric polarization between the electron traveling layer and the electron supply layer. For example, use of InAlN (indium aluminum nitride) as the electron supply layer to increase a concentration of the two-dimensional electron gas is disclosed in JP 2012-256704A.

SUMMARY OF THE INVENTION

When AlGaN (aluminum gallium nitride) is used as the electron supply layer, a self-polarization difference and conduction band energy discontinuity between the AlGaN electron supply layer and a GaN electron traveling layer increase with the increase in an Al composition of the AlGaN electron supply layer. Accordingly, a two-dimensional electron gas concentration may increase. However, if the Al composition increases, lattice distortion of the AlGaN electron supply layer and the GaN (gallium nitride) electron traveling layer increases and cracks occur.

In the invention described in JP 2012-256704A, since InAlN is the electron supply layer, lattice distortion of the InAlN electron supply layer and the GaN electron traveling layer may be small and a self-polarization difference and conduction band energy discontinuity may increase. Thus, cracks or the like may not occur and a two-dimensional electron gas concentration may increase. The two-dimensional gas concentration of about $2 \times 10^{13}$ cm$^{-2}$ can be theoretically realized.

When the InAlN electron supply layer is grown at a high temperature, In is sublimated. Therefore, the InAlN electron supply layer is formed at a lower temperature than the GaN layer. Further, when the InAlN electron supply layer becomes the outermost surface of the semiconductor layers, a surface of InAlN is oxidized since InAlN contains Al. In order to suppress this, a GaN cap layer is formed on the InAlN electron supply layer. The GaN layer is grown, for example, in the substrate temperature of about 1000° C. Therefore, In is sublimated from the InAlN electron supply layer while the temperature of the substrate is increased for growth of the GaN layer. Thus, quality of a layer between the InAlN electron supply layer and the GaN cap layer deteriorates. Thus, quality of the InAlN layer deteriorates when the epitaxial layer is formed on the InAlN layer.

The present invention has been made in view of the aforementioned problems, and an object of the present invention is to suppress deterioration of quality of an InAlN layer.

A method of manufacturing a semiconductor device according to one aspect of the present invention includes a step of forming a first layer of InAlN; a step of forming a second layer of InAlGaN on the first layer under a growth temperature higher than that of the first layer; and a step of forming a third layer of GaN, AlGaN or InGaN under a growth temperature higher than that of the first layer.

A semiconductor device according to one aspect of the present invention includes a first layer of InAlN having an upper face; a second layer of InAlGaN having an upper face and a lower face, the lower face of the second layer being in contact with the upper face of the first layer; and a third layer of GaN, InGaN or AlGaN having a lower face in contact with the upper face of the second layer.

According to the present invention, it is possible to suppress deterioration of the quality of the InAlN layer.

DESCRIPTION OF THE PREFERRED EMBODIMENTS

Figure 1:
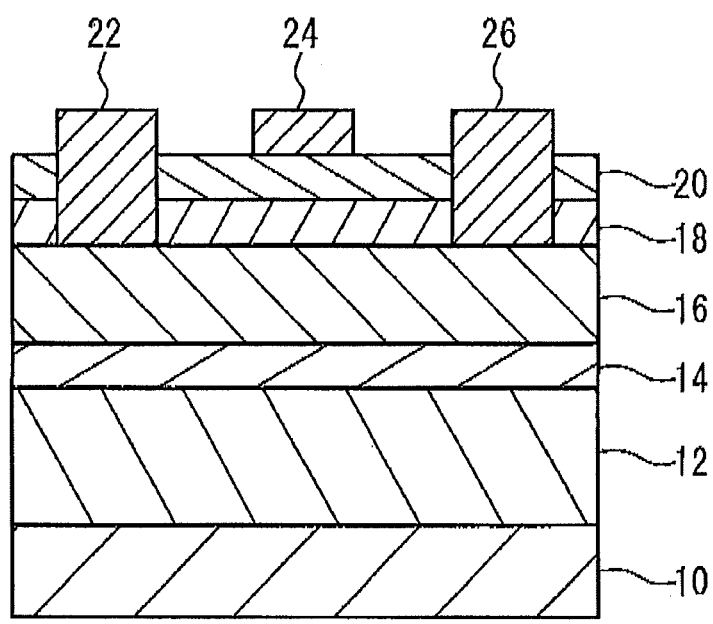
FIG. 1 is a cross-sectional view of a semiconductor device according to an embodiment.

Description of an Embodiment of the Present Invention

First, content of an embodiment of the present invention will be listed and described. A method of manufacturing a semiconductor device according to one embodiment of the present invention includes a step of forming a first layer of InAlN; a step of forming a second layer of InAlGaN on the first layer under a growth temperature higher than that of the first layer; and a step of forming a third layer of GaN, AlGaN or InGaN under a growth temperature higher than that of the first layer.

In the embodiment, the growth temperature of the third layer may be equal to or greater than the growth temperature of the second layer.

Further, in the embodiment, the third layer may be GaN and the growth temperature of the third layer may be greater than the growth temperature of the second layer.

Further, in the embodiment, the growth temperature of the second layer may increase from a side of the first layer to a side of the third layer.

Further, in the embodiment, a supply amount of a Ga source gas may be increased and a supply amount of an Al source gas may be decreased in accordance with the increase in growth temperature in the step of forming the second layer.

Further, in the embodiment, a supply amount of an In source gas may be increased in accordance with the increase in growth temperature in the step of forming the second layer.

Further, in the embodiment, an In composition ratio x of the first layer may be 12% or more and 36% or less in $In_xAl_{1-x}N$.

Further, in the embodiment, the second layer may have a composition to provide lattice matching to the first layer.

Further, in the embodiment, the step of forming the second layer may be executed in a range of the growth temperature from 700° C. to 1050° C.

Further, in the embodiment, the forming of the first, second and third layers may be executed by MOCVD method.

A semiconductor device according to one embodiment of the present invention includes a first layer of InAlN having an upper face; a second layer of InAlGaN having an upper face and a lower face, the lower face of the second layer being in contact with the upper face of the first layer; and a third layer of GaN, InGaN or AlGaN having a lower face in contact with the upper face of the second layer.

In the embodiment, the first layer may have an In composition ratio x between 12% and 36% in $In_xAl_{1-x}N$.

Further, in the embodiment, the In composition ratio x of the first layer may be 18%.

Further, in the embodiment, the first, second and third layers may be lattice-matched to each other.

Further, in the embodiment, the semiconductor device may further include a fourth layer of GaN located under the first layer.

Further, in the embodiment, the semiconductor device may further include a fifth layer of AlN located between the fourth layer and the first layer.

Details of an Embodiment of the Present Invention

Hereinafter, a method of manufacturing a semiconductor device and the semiconductor device according to an embodiment of the present invention will be described with reference to the drawings.

FIG. 1 is a cross-sectional view of a semiconductor device according to an embodiment. An electron supply layer 16 serving as an InAlN layer and a cap layer 20 serving as an epitaxial layer will be described as examples. An electron traveling layer 12, a spacer layer 14, the electron supply layer 16, a buffer layer 18 and the cap layer 20 (the epitaxial layer) are sequentially formed on a substrate 10. For example, the buffer layer 18 is formed in contact with a surface of the electron supply layer 16, and the cap layer 20 is formed in contact with a surface of the buffer layer 18, as illustrated in FIG. 1. The substrate 10 is, for example, a SiC (silicon carbide) substrate, a Si (silicon) substrate, a sapphire substrate, a GaN substrate or a $Ga_2O_3$ (gallium oxide) substrate. The electron traveling layer 12 is a nitride semiconductor layer and is, for example, a GaN layer. A buffer layer or a nucleation layer such as an AlN layer may be formed between the substrate 10 and the electron traveling layer 12. When the substrate 10 is a SiC substrate, the nucleation layer is, for example, an AlN (aluminum nitride) layer, and when the substrate 10 is a Si substrate, the buffer layer is, for example, a superlattice layer of an AlN layer and a GaN layer.

The spacer layer 14 is, for example, an AlN layer. The spacer layer 14 may not be formed. The electron supply layer 16 is an InAlN layer, and lattice-matches to the GaN layer constituting the cap layer 20 in an a-axis direction. The buffer layer 18 is an InAlGaN (indium aluminum gallium nitride) layer, and lattice-matches to the GaN layer constituting the cap layer 20 in an a-axis direction. The cap layer 20 is the GaN layer. A gate electrode 24 is formed on the cap layer 20. The gate electrode 24, for example, includes a Ni (nickel) film and a Au (gold) film from the substrate 10 side (i.e., is a stack including the Ni film and the Au film formed on the Ni film). A source electrode 22 and a drain electrode 26 are formed on the electron supply layer 16 with the gate electrode 24 interposed therebetween. Each of the source electrode 22 and the drain electrode 26, for example, includes a Ti (titanium) film and an Al (aluminum) film from the substrate 10 side (i.e., is a stack including the Ti film and the Al film formed on the Ti film). This Ti film may be a Ta (tantalum) film. The source electrode 22 and the drain electrode 26 may be buried to reach the electron supply layer 16 or may be formed on the cap layer 20.

Figure 2A:
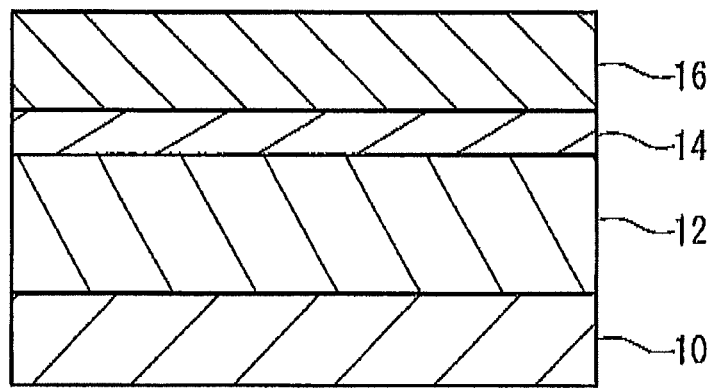
FIG. 2A is a cross-sectional view illustrating a method of manufacturing a semiconductor device according to an embodiment.
Figure 2B:
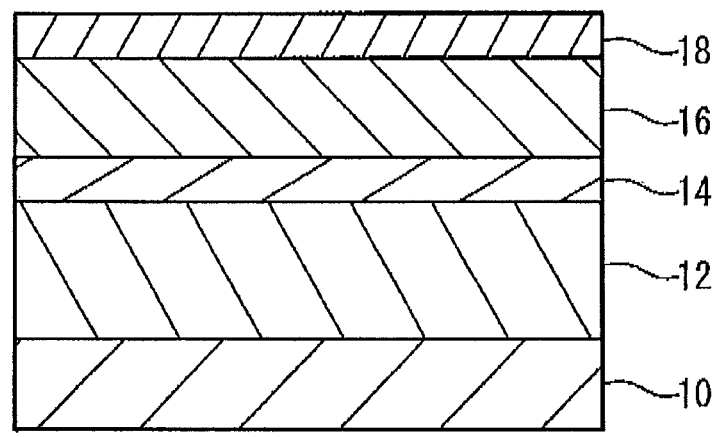
FIG. 2B is a view continuing from FIG. 2A and is a cross-sectional view illustrating the method of manufacturing a semiconductor device according to the embodiment.
Figure 2C:
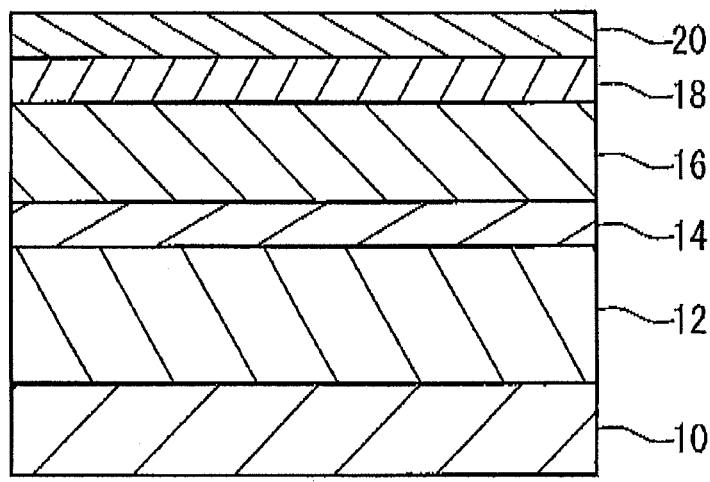
FIG. 2C is a view continuing from FIG. 2B and is a cross-sectional view illustrating the method of manufacturing a semiconductor device according to the embodiment.
Figure 3:
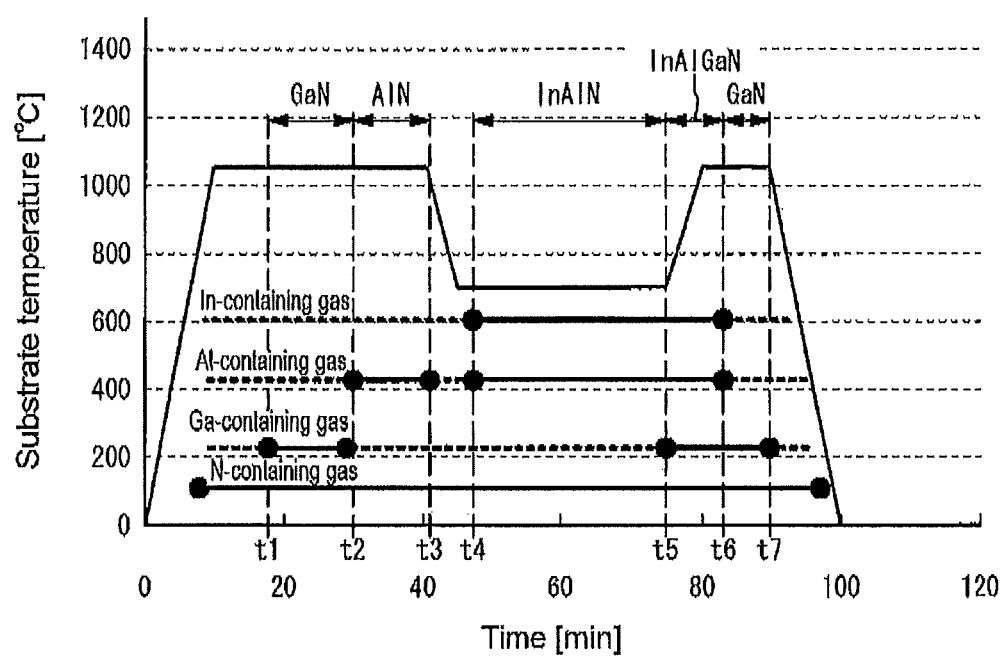
FIG. 3 is a diagram illustrating a substrate temperature and introduction of source gases with respect to time in the method of manufacturing a semiconductor device according to the embodiment.

FIGS. 2A to 2C are cross-sectional views illustrating a method of manufacturing a semiconductor device according to an embodiment. FIG. 3 is a diagram illustrating a substrate temperature and introduction of source gases (an In-containing gas as an In source gas, an Al-containing gas as an Al source gas, a Ga-containing gas as a Ga source gas and a N-containing gas as a N source gas) with respect to time in the method of manufacturing a semiconductor device according to the embodiment. In FIG. 3, solid lines among the straight lines indicating the source gases indicate that the source gas is supplied, and dashed lines among the straight lines indicating the source gases indicate that the source gas is not supplied. For formation of each layer, an MOCVD (Metal Organic Chemical Vapor Deposition) method is used. The substrate 10 has, for example, a (0001) main surface, and a stack direction of the nitride semiconductor layer is, for example, a [0001] direction.

First, a step performed in the method of manufacturing a semiconductor device according to the embodiment will be described with reference to FIGS. 2A and 3. The substrate 10 which is a SiC substrate is introduced into a chamber in a hydrogen atmosphere of an MOCVD apparatus. A temperature of the substrate 10 is increased in a state in which $NH_3$ (ammonia) is supplied as a N-containing gas into the chamber, and In-, Al- and Ga-containing gases are not supplied. At time t1 at which the temperature of the substrate 10 is stabilized, the Ga-containing gas and the N-containing gas are supplied into the chamber to form the electron traveling layer 12 composed of GaN on the substrate 10. An example of formation conditions for the electron traveling layer 12 is as follows:

Ga-containing gas: TMG (trimethyl gallium) or TEG (triethyl gallium)
N-containing gas: $NH_3$
Carrier gas: hydrogen
Substrate temperature: a value ranging from 900° C. to 1100° C. (1050° C. in the example illustrated in FIG. 3)
Film thickness: about 1 μm At time t2, the supply of the Ga-containing gas stops, and supply of the Al-containing gas starts. Accordingly, the formation of the electron traveling layer 12 stops, and the spacer layer 14 composed of AlN is formed on the electron traveling layer 12. An example of formation conditions for the spacer layer 14 is as follows:

Al-containing gas: TMA (trimethyl aluminum) or TEA (triethyl aluminum)
N-containing gas: $NH_3$
Carrier gas: hydrogen
Substrate temperature: a value ranging from 900° C. to 1100° C. (1050° C. in the example illustrated in FIG. 3)
Film thickness: 0.5 nm or more and 1 nm or less At time t3, the supply of the Al-containing gas stops. Accordingly, the formation of the spacer layer 14 stops. The temperature of the substrate is decreased. In this step, the N-containing gas is supplied, and the In-containing gas, the Al-containing gas and the Ga-containing gas are not supplied. Thus, no semiconductor layer is formed.

At time t4 at which the temperature of the substrate 10 is stabilized, the In-containing gas and the Al-containing gas are supplied. The Ga-containing gas is not supplied. Accordingly, the electron supply layer 16 including InAlN is formed on the spacer layer 14. The reason for decreasing the substrate temperature at the time of InAlN film formation is to suppress sublimation of In from an InAlN surface. An example of formation conditions of the electron supply layer 16 is as follows.

In-containing gas: TMI (trimethyl indium)
Al-containing gas: TMA or TEA
N-containing gas: $NH_3$
Carrier gas: nitrogen
Substrate temperature: a value ranging from 600° C. to 800° C. (700° C. in the example illustrated in FIG. 3)
Film thickness: 5 nm or more and 20 nm or less Next, a step performed in the method of manufacturing a semiconductor device according to the embodiment following the above step will be described with reference to FIGS. 2B and 3. At time t5, the In-containing gas and the Al-containing gas are supplied, the Ga-containing gas is also supplied, and the temperature of the substrate 10 is increased. Accordingly, the buffer layer 18 composed of InAlGaN is formed on the electron supply layer 16. An example of formation conditions for the buffer layer 18 is as follows:

In-containing gas: TMI
Al-containing gas: TMA or TEA
Ga-containing gas: TMG or TEG
N-containing gas: $NH_3$
Carrier gas: nitrogen
Substrate temperature: increased from 700° C. to 1050° C. in the example illustrated in FIG. 3

Further, the buffer layer 18 may be grown in a step of increasing a growth temperature from a growth temperature of the electron supply layer 16 to a growth temperature of the cap layer 20. In this case, no intentional temperature setting of the growth temperature need be performed.

Film thickness: 0.5 nm or more and 5 nm or less

Figure 4:
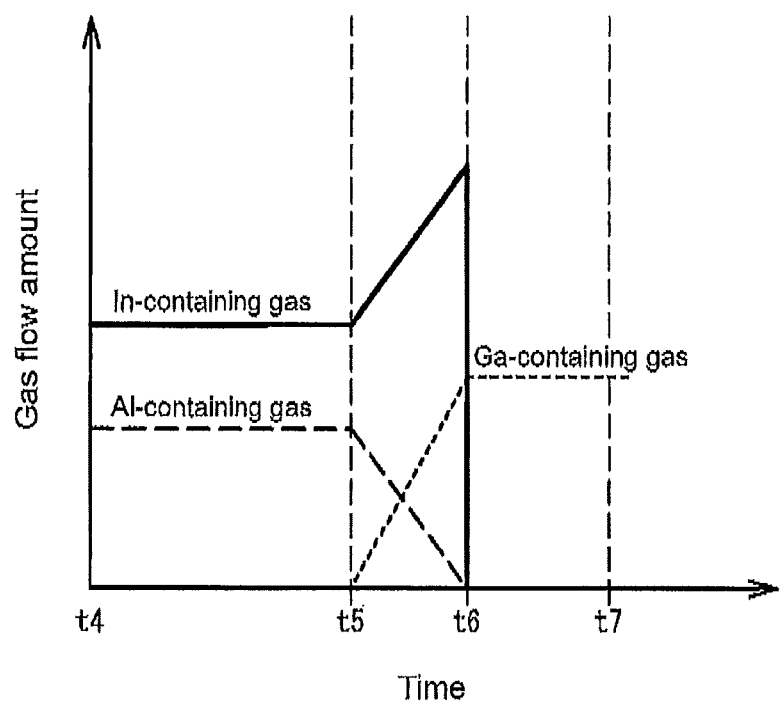
FIG. 4 is a diagram illustrating a flow amount of the source gases with respect to time in the method of manufacturing a semiconductor device according to the embodiment.

Next, a step performed in the method of manufacturing a semiconductor device according to the embodiment following the above step will be described with reference to FIGS. 2C and 3. At time t6, the increase in temperature of the substrate 10 ends, and then the supply of the In-containing gas and the Al-containing gas stops and the supply of the Ga-containing gas continues. Accordingly, the cap layer 20 composed of GaN is formed on the buffer layer 18. An example of formation conditions for the cap layer 20 is as follows:

Ga-containing gas: TMG or TEG
N-containing gas: $NH_3$
Substrate temperature: a value ranging from 900° C. to 1100° C. (1050° C. in the example illustrated in FIG. 3)
Film thickness: 0.5 nm or more and 5 nm or less FIG. 4 is a diagram illustrating a flow amount of the source gases with respect to time in the method of manufacturing a semiconductor device according to the embodiment. While the electron supply layer 16 is being formed, flow amounts of the In-containing gas and the Al-containing gas are constant. At time t5, when the temperature of the substrate is increased, the flow amount of the In-containing gas increases over time, the flow amount of the Al-containing gas decreases over time, and a flow amount of the Ga-containing gas increases from 0 over time. At time t6, the supply of the In-containing gas and the Al-containing gas stops, and the flow amount of the Ga-containing gas is constant.

For example, the source gases and their flow amounts during formation of the InAlN electron supply layer 16 are as follows:

TMI: 35 μmol/minute
TMA: 25 μmol/minute
TMG: 0 μmol/minute

The source gases and their flow amounts when the temperature increase starts (time t5) are as follows:

TMI: 35 μmol/minute
TMA: 25 μmol/minute
TMG: 0 μmol/minute

The source gases and their flow amounts when the temperature increase ends (time t6) are as follows:

TMI: 50 μmol/minute
TMA: 2 μmol/minute
TMG: 30 μmol/minute

The source gases and their flow amounts during formation of the GaN cap layer 20 are as follows:

TMI: 0 μmol/minute
TMA: 0 μmol/minute
TMG: 30 μmol/minute

Further, the source gas of an n-type dopant is $SiH_4$.

Figure 5:
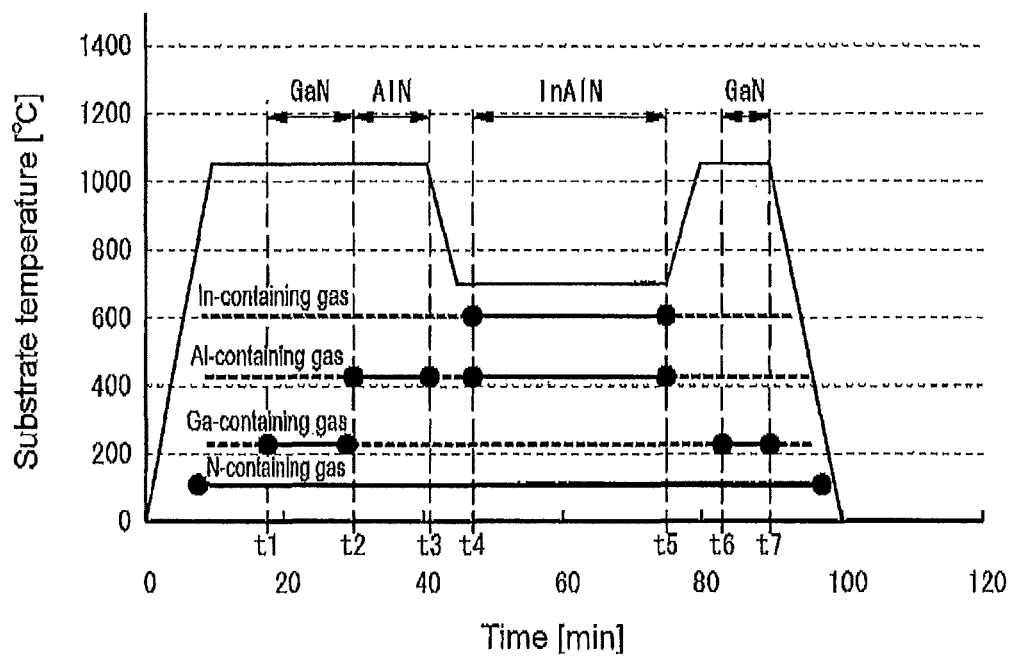
FIG. 5 is a diagram illustrating a substrate temperature and introduction of source gases with respect to time in a method of manufacturing a semiconductor device according to a comparative example.

A comparative example and its problems will be described in order to describe the effects of the embodiment as described above. FIG. 5 is a diagram illustrating a substrate temperature and introduction of source gases with respect to time in a method of manufacturing a semiconductor device according to a comparative example. In the method of manufacturing a semiconductor device according to the comparative example, none of an In-containing gas, an Al-containing gas and a Ga-containing gas is supplied between time t5 at which formation of an electron supply layer 16 ends and time t6 at which formation of a cap layer 20 starts, as illustrated in FIG. 5. Other matters are the same as those in the method of manufacturing a semiconductor device according to the embodiment illustrated in FIG. 3 and a description thereof is omitted.

Figure 6:
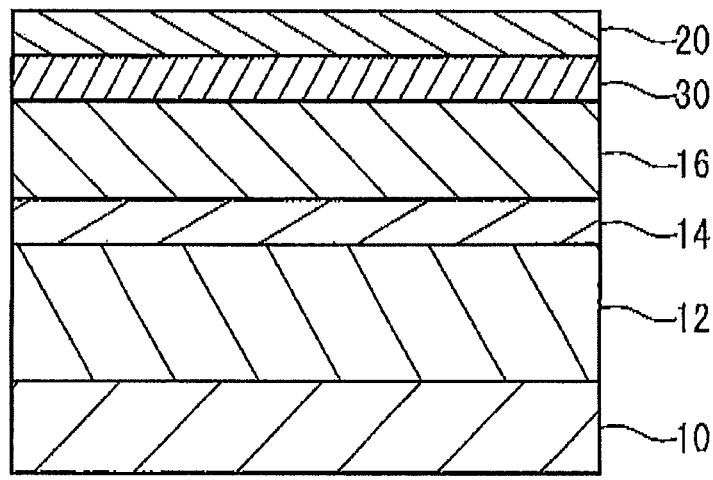
FIG. 6 is a cross-sectional view of a semiconductor layer manufactured using the method of manufacturing a semiconductor device according to the comparative example.

FIG. 6 is a cross-sectional view of a semiconductor layer manufactured using the method of manufacturing a semiconductor device according to the comparative example. In the semiconductor layer, a piezoelectric charge generation layer 30 is formed between an electron supply layer 16 and a cap layer 20, as illustrated in FIG. 6.

Figure 7:
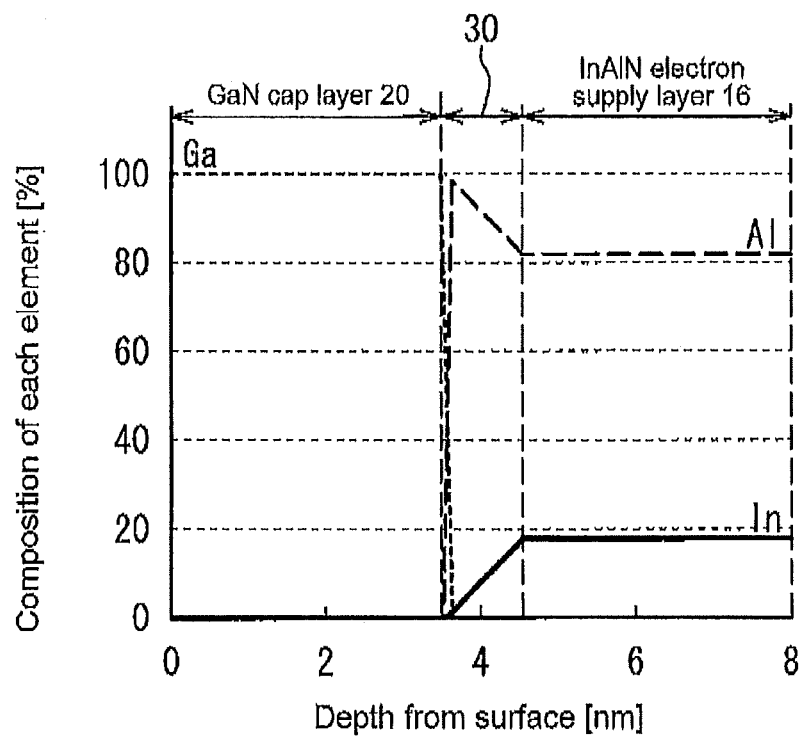
FIG. 7 is a schematic view illustrating a composition of each element with respect to a depth from a semiconductor layer surface in the semiconductor layer manufactured using the method of manufacturing a semiconductor device according to the comparative example.

FIG. 7 is a schematic view illustrating a composition of each element with respect to a depth from a semiconductor layer surface in the semiconductor layer manufactured using the method of manufacturing a semiconductor device according to the comparative example. In the method of manufacturing a semiconductor device according to the comparative example, a temperature is increased without introducing source gases after the InAlN electron supply layer 16 is formed, as illustrated in FIG. 7. Therefore, In is sublimated as a surface of the InAlN electron supply layer 16 is exposed to the high temperature. Accordingly, a piezoelectric charge generation layer 30 having a small composition of In is formed on the side of a surface of the InAlN electron supply layer 16. When the substrate temperature is increased, In the InAlN is increasingly sublimated. Accordingly, a layer in which a composition ratio of Al is near 100% is formed near an interface with the GaN cap layer 20 within the piezoelectric charge generation layer 30.

Figure 8:
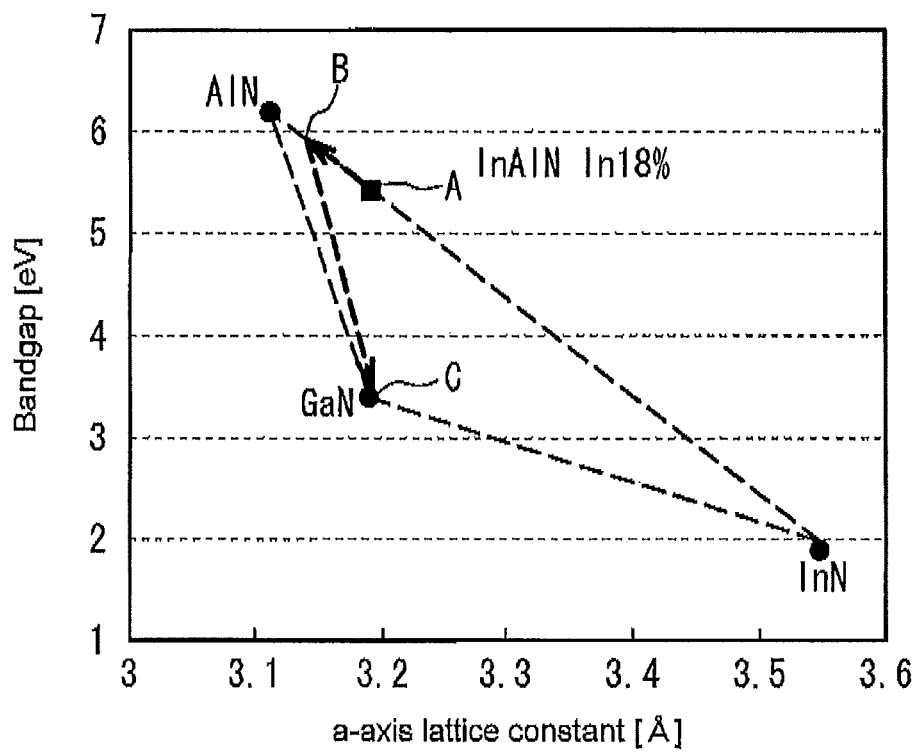
FIG. 8 is a diagram illustrating a bandgap with respect to an a-axis lattice constant in the semiconductor layer manufactured using the method of manufacturing a semiconductor device according to the comparative example.

FIG. 8 is a diagram illustrating a bandgap with respect to an a-axis lattice constant in the semiconductor layer manufactured using the method of manufacturing a semiconductor device according to the comparative example. The a-axis lattice constant of InN is greater and the a-axis lattice constant of AlN is smaller than that of GaN, as illustrated in FIG. 8. When an In composition ratio is approximately 18%, InAlN which is a mixed crystal of InN and AlN has substantially the same a-axis lattice constant as GaN. Therefore, in $In_xAl_{1-x}N$ for the electron supply layer 16, $0.12 \leq x \leq 0.36$. Accordingly, it is difficult for cracks due to the lattice distortion in an a-axis direction of InAlN and GaN to occur.

A dashed line arrow illustrated in FIG. 8 indicates a change in element composition in the piezoelectric charge generation layer 30. Between time t4 and time t5 illustrated in FIG. 5, formation of the InAlN electron supply layer 16 is performed at a low temperature from 600° C. to 800° C. Therefore, the composition of the electron supply layer 16 is substantially as has been set. This is shown in position A (InAlN with an In composition ratio of approximately 18%) of FIG. 8. The temperature of the substrate is increased in a period between time t5 and time t6 of FIG. 5. Accordingly, In is sublimated from the surface of the InAlN electron supply layer 16. Accordingly, the surface of the InAlN electron supply layer 16 has a composition close to AlN at time t6. This is shown in position B of FIG. 8. The GaN cap layer 20 is formed from time t6. This is shown in position C of FIG. 8.

Thus, piezoelectric charges are generated due to an a-axis lattice constant difference between the piezoelectric charge generation layer 30 and the GaN cap layer 20. Further, a lattice defect is introduced into the piezoelectric charge generation layer 30. For example, when a gate is formed on the GaN cap layer 20 formed in this way, it is difficult for a high frequency signal of the gate to be applied to a two-dimensional electron gas due to piezoelectric charges and the lattice defect. Thus, the performance of the semiconductor device deteriorates.

Figure 9:
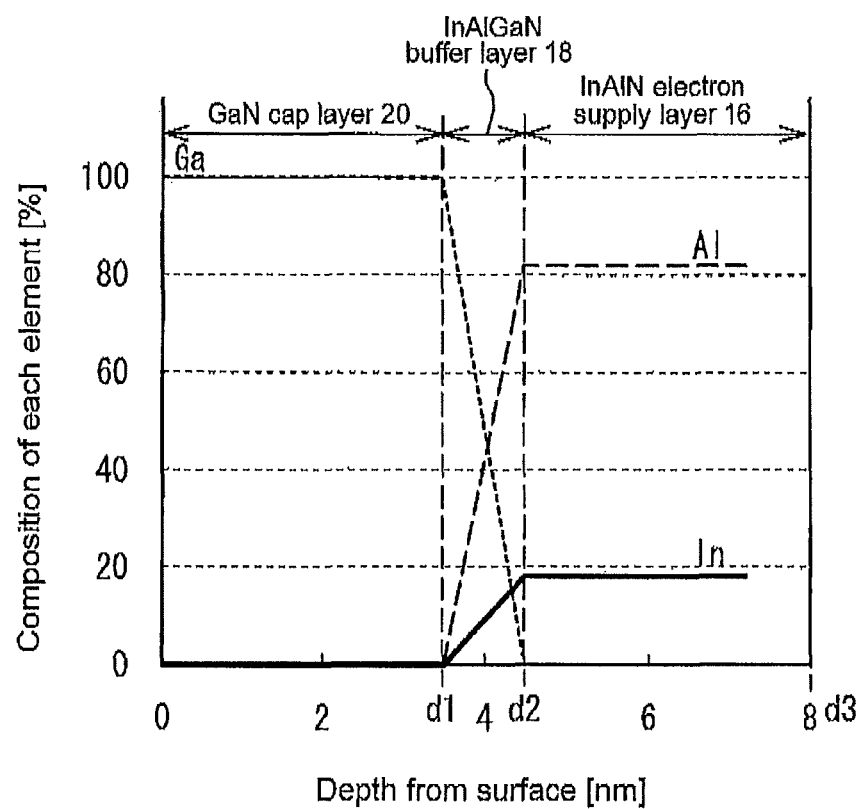
FIG. 9 is a schematic view illustrating a composition of each element with respect to a depth from the semiconductor layer surface in the semiconductor layer manufactured using the method of manufacturing a semiconductor device according to the embodiment.

Solutions to the problems of the comparative example in the embodiment as described above will be described. FIG. 9 is a schematic view illustrating a composition of each element with respect to a depth from the semiconductor layer surface in the semiconductor layer manufactured using the method of manufacturing a semiconductor device according to the embodiment. The InAlGaN buffer layer 18 is formed in depths d1 to d2 between the InAlN electron supply layer 16 and the GaN cap layer 20, as illustrated in FIG. 9. Within the InAlGaN buffer layer 18, Al and In compositions uniformly decrease, and a Ga composition uniformly increases from the InAlN electron supply layer 16 to the GaN cap layer 20. In FIG. 9, within the InAlGaN buffer layer 18, the compositions of Al, In and Ga change linearly, but may change in a curve.

Figure 10:
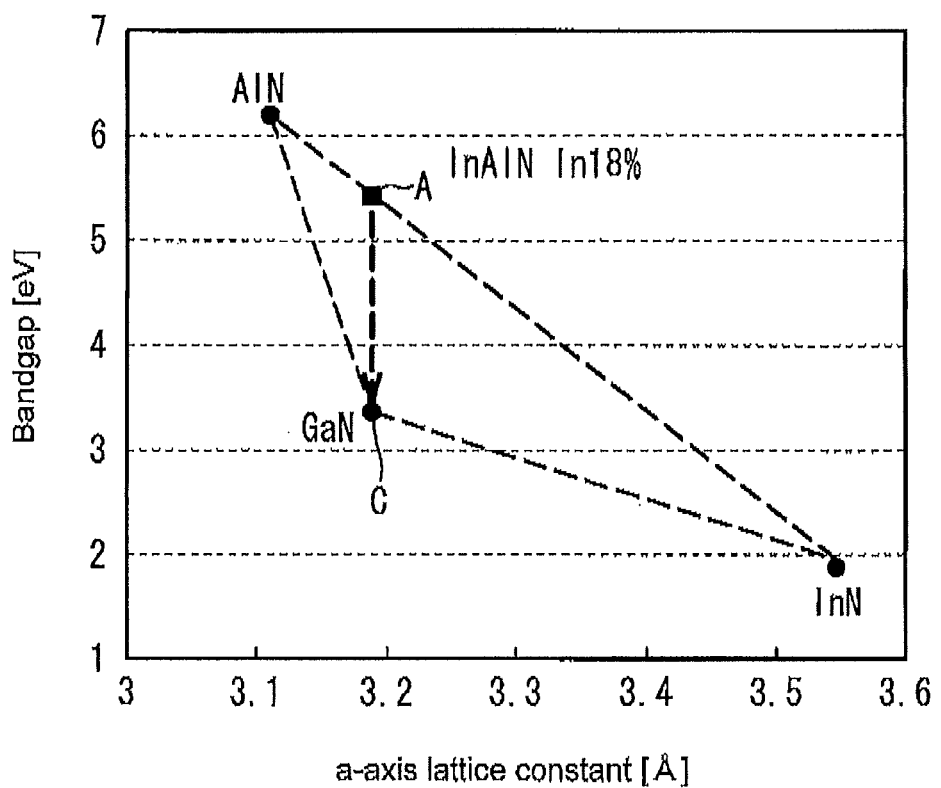
FIG. 10 is a diagram illustrating a bandgap with respect to an a-axis lattice constant in the semiconductor layer manufactured using the method of manufacturing a semiconductor device according to the embodiment.

FIG. 10 is a diagram illustrating a bandgap with respect to an a-axis lattice constant in the semiconductor layer manufactured using the method of manufacturing a semiconductor device according to the embodiment. The InAlN electron supply layer 16 is shown in position A, as illustrated in FIG. 10. The GaN cap layer 20 is shown in position C. In the InAlGaN buffer layer 18, the In and Al compositions uniformly decrease and the Ga composition uniformly increases from position A to position C. Accordingly, a composition of the InAlGaN buffer layer 18 changes so that the a-axis lattice constant hardly changes from position A to position C. Thus, there is substantially no lattice distortion and the piezoelectric charges and the lattice defects hardly occur between the InAlN electron supply layer 16 and the GaN cap layer 20. For example, when the gate is formed on the GaN cap layer 20 formed in this way, a high frequency signal of the gate is easily applied to the two-dimensional electron gas, and performance deterioration of the semiconductor device can be suppressed.

In the above-described embodiment, the InAlGaN layer which is the buffer layer 18 is formed on the electron supply layer 16 composed of InAlN, and the GaN layer which is the cap layer 20 is formed on the InAlGaN layer, as illustrated in FIG. 1. For example, the InAlGaN buffer layer 18 is formed while the temperature of the substrate 10 is increased from the substrate temperature of the substrate 10 in the step of forming the electron supply layer 16. In other words, the InAlGaN layer is formed while the growth temperature is increased from the growth temperature in the step of forming the InAlN layer. An epitaxial layer is formed on the InAlGaN layer at a growth temperature higher than the growth temperature in the step of forming the InAlN layer. Here, the epitaxial layer is a layer whose composition does not include at least one of the elements constituting the InAlGaN layer. Accordingly, it is possible to suppress lattice distortion between the InAlN layer and the InAlGaN layer. Thus, it is possible to suppress deterioration of quality of the InAlN layer.

In the above-described embodiment, the InAlGaN layer has a composition of In and Al increasing toward the electron supply layer 16 and a composition of Ga increasing toward the GaN layer. Further, for example, in the step of forming the InAlGaN layer, a supply amount of the Ga-containing gas increases and a supply amount of the Al-containing gas decreases with the increase in growth temperature, as illustrated in FIG. 4, such that the lattice constant of the InAlGaN layer can be substantially the same as that of the GaN layer.

Further, since In is easily sublimated as the temperature increases, it is preferable to increase a supply amount of the In-containing gas with the increase in growth temperature in the step of forming the InAlGaN layer of the above-described embodiment, as illustrated in FIG. 4. However, it is preferable for the increase in supply amount of the In-containing gas in that case to be adjusted so that the lattice constant of the InAlGaN layer is lattice matched to the lattice constant of the GaN layer in an a-axis direction.

In the embodiment described above, it is preferable for the In composition ratio of the InAlN electron supply layer 16 to be 12% or more and 36% or less. Accordingly, it is possible to suppress cracks due to lattice distortion of the InAlN electron supply layer 16 and the GaN layer. It is more preferable for the In composition ratio of the InAlN electron supply layer 16 to be 15% or more and 20% or less. Further, it is preferable for the InAlGaN layer to have a composition to provide lattice matching to the electron supply layer 16.

In the above-described embodiment, it is preferable for the step of forming the InAlGaN buffer layer 18 to be executed in a range of the growth temperature ranging from 700° C. to 1050° C.

In the above-described embodiment, it is preferable for some of the growth temperatures in the step of forming the InAlGaN buffer layer 18 to be the same as those in the step of forming the cap layer 20, as in a period between time t5 and time t6 illustrated in FIG. 3. For example, it is preferable for the growth temperature at a time point at which the growth of the buffer layer 18 ends to be the same as that in the step of forming the cap layer 20. Accordingly, it is possible to continuously form the cap layer 20 on the buffer layer 18 at a uniform growth temperature.

In the above-described embodiment, it is preferable for the electron traveling layer 12 to have a composition to provide lattice matching to the InAlN electron supply layer 16. For example, when the composition of the electron supply layer 16 is $In_xAl_{1-x}N$ and the composition of the electron traveling layer 12 is $B_\alpha Al_\beta Ga_\gamma In_{1-\alpha-\beta-\gamma}N$, the electron traveling layer 12 and the electron supply layer 16 are lattice matched to each other by satisfying the following equation:

$$2.55\alpha+3.11\beta+3.19\gamma+3.55(1-\alpha-\beta-\gamma)=3.55x+3.11(1-x)$$

In the above-described embodiment, the GaN cap layer 20 may be undoped GaN or may be n-type GaN. The n-type GaN cap layer 20 is preferable since its surface charges are stabilized. Further, it is possible to improve an activation rate of a dopant by forming the GaN cap layer 20 at a high temperature ranging from about 900° C. to about 1100° C. Accordingly, surface charges are more stabilized, the bandgap in the semiconductor layer is stabilized, and failure of the semiconductor device decreases.

In the above-described embodiment, a composition of the epitaxial layer does not include at least one of the elements constituting the InAlGaN layer. For example, the epitaxial layer includes Ga among In, Al and Ga and does not include at least one of In and Al. For example, the InAlN layer and the epitaxial layer have substantially the same lattice constant, as in position A and position C in FIG. 10. In this case, if the buffer layer 18 is not formed, the piezoelectric charge generation layer is formed, as in the comparative example illustrated in FIG. 8. Thus, it is preferable to form the InAlGaN buffer layer 18, as in the case of the above-described embodiment.

While the embodiments of the present invention have been described above in detail, the present invention is not limited to such specific embodiments, and various variations and changes may be made without departing from the gist of the present invention defined in the claims.

What is claimed is:

1. A method of manufacturing a semiconductor device, the method comprising:
   introducing a substrate in a chamber; and
   forming an InAlGaN layer on the substrate, the InAlGaN layer having an upper side and a lower side,
   wherein an In composition of the upper side of the InAlGaN layer is smaller than that of the lower side of the InAlGaN layer,
   wherein a supply amount of an In containing gas for source gases of the upper side of the InAlGaN layer is greater than that of the lower side of the InAlGaN layer,
   wherein the growth temperature of the upper side of the InAlGaN layer is higher than that of the lower side of the InAlGaN layer.

2. The method of manufacturing a semiconductor device according to claim 1,
   wherein the supply amount of Ga containing gas for the source gases of the upper side of the InAlGaN layer is greater than that of the lower side of the InAlGaN layer, and supply amount of Al containing gas for the source gases of the upper side of the InAlGaN layer is smaller than that of the lower side of the InAlGaN layer.

3. The method of manufacturing a semiconductor device according to claim 1, wherein the InAlGaN layer is formed by MOCVD method.

4. The method of manufacturing a semiconductor device according to claim 1, wherein the InAlGaN layer is formed on a layer containing In.

5. The method of manufacturing a semiconductor device according to claim 1, wherein the substrate is composed of one of a material selected from SiC, Si, sapphire, GaN and $Ga_2O_3$.

* * * * *